(12) United States Patent
Jeong et al.

(10) Patent No.: US 7,811,934 B2
(45) Date of Patent: Oct. 12, 2010

(54) METHOD OF MANUFACTURING NANOELECTRODE LINES USING NANOIMPRINT LITHOGRAPHY PROCESS

(75) Inventors: Mi Hee Jeong, Daejeon (KR); Hyo Young Lee, Daejeon (KR); Nak Jin Choi, Daegu (KR); Kang Ho Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 233 days.

(21) Appl. No.: 12/045,769

(22) Filed: Mar. 11, 2008

(65) Prior Publication Data
US 2009/0023288 A1 Jan. 22, 2009

(30) Foreign Application Priority Data
Jul. 19, 2007 (KR) ...................... 10-2007-0071993

(51) Int. Cl.
*H01L 21/033* (2006.01)
*H01L 21/311* (2006.01)

(52) U.S. Cl. ............... 438/669; 977/889; 257/E21.574; 257/E21.52

(58) Field of Classification Search ................. 438/597, 438/669; 977/887; 257/E21.52, E21.574; *H01L 21/033, H01L 21/311*
See application file for complete search history.

(56) References Cited

U.S. PATENT DOCUMENTS

| | | | | |
|---|---|---|---|---|
| 4,863,833 A | * | 9/1989 | Fukuyama et al. | ....... 430/286.1 |
| 7,166,786 B2 | * | 1/2007 | Tavkhelidze et al. | .......... 216/54 |
| 7,510,388 B2 | * | 3/2009 | Terasaki et al. | .......... 425/174.4 |
| 2006/0228877 A1 | * | 10/2006 | Kamijima | .................... 438/597 |
| 2006/0261518 A1 | | 11/2006 | Willson et al. | |
| 2006/0290017 A1 | * | 12/2006 | Yanagisawa | ............... 264/1.27 |

FOREIGN PATENT DOCUMENTS

| | | | |
|---|---|---|---|
| JP | 2004-200663 | | 7/2004 |
| JP | 2004335775 | * | 11/2004 |
| KR | 2002-0079342 | * | 10/2002 |
| KR | 10-2007-0054938 | | 5/2007 |
| KR | 10-0741343 | | 7/2007 |

OTHER PUBLICATIONS

"Direct pattern transfer for sub-45nm features using nanoimprint lithography", Ngoc V. Le et al., Microelectronic Engineering 83 (2006) 839-842.

* cited by examiner

*Primary Examiner*—Kiesha R Bryant
*Assistant Examiner*—Mark W Tornow
(74) *Attorney, Agent, or Firm*—Rabin & Berdo, P.C.

(57) ABSTRACT

Provided are a method of manufacturing nanoelectrode lines. The method includes the steps of: sequentially forming an insulating layer, a first photoresist layer, and a drop-shaped second photoresist on a substrate; disposing an imprint mold having a plurality of molding patterns over the second photoresist; applying pressure to the mold to allow the second photoresist to flow into the mold patterns; irradiating ultraviolet (UV) light onto the mold to cure the second photoresist; removing the mold from the cured second photoresist and patterning the second photoresist; patterning the first photoresist layer using the patterned second photoresist as a mask; patterning the insulating layer; and forming a metal layer between the patterned insulating layers. In this method, metal electrode lines are formed between insulating layers using an imprint lithography process, so that nanoelectronic devices can be freed from crosstalk between the metal electrode lines.

11 Claims, 5 Drawing Sheets

US 7,811,934 B2

METHOD OF MANUFACTURING NANOELECTRODE LINES USING NANOIMPRINT LITHOGRAPHY PROCESS

CROSS-REFERENCE TO RELATED APPLICATION

This application claims priority to and the benefit of Korean Patent Application No. 2007-71993, filed Jul. 19, 2007, the disclosure of which is incorporated herein by reference in its entirety.

BACKGROUND

1. Field of the Invention

The present invention relates to a method of manufacturing nanoelectrode lines for nanoelectronic devices and, more particularly, to a method of manufacturing nanoelectrode lines between insulating layer patterns using a nanoimprint lithography process.

2. Discussion of Related Art

Conventionally, manufacture of semiconductor devices, electronic devices, photoelectric devices, magnetic devices, and display devices involves a photolithography process of forming fine patterns on a substrate. The photolithography process includes coating a substrate including a polymer layer with a polymer material having reactivity to light, exposing the polymer material to light by allowing light to pass through an arbitrary pattern, removing the exposed polymer material using a developing process, and forming a desired pattern mask on a material to be patterned. Subsequently, an etching process is performed using the pattern mask, thereby desirably patterning the polymer material stacked on the substrate. However, since a circuit linewidth or a pattern linewidth is determined by the wavelength of light used for the exposure process, it is not easy to form superfine patterns, for example, 100 nm fine patterns, on the substrate using the photolithography process.

In order to overcome the restrictions of the photolithography process, a nanoimprint lithography process has recently been employed. The nanoimprint lithography process involves preparing a mold including a desired pattern, coating a substrate with a thermoplastic polymer thin layer, locating the mold opposite to the substrate and applying high heat and high pressure between pressure plates, and separating the mold from the substrate to thereby transfer the pattern of the mold to the surface of the thermoplastic polymer thin layer formed on the substrate. However, since the nanoimprint lithography process is performed under a high process pressure, the mold and the substrate may be deformed or damaged. Also, the polymer thin layer can be patterned using the flowability of a heated polymer material, so that formation of large patterns takes much time. Furthermore, because a portion of the polymer thin layer, which is pressed by a protruding portion (or a convex portion) of the mold, is not completely removed but left, an additional process may be required to obtain fine patterns.

When nanoelectrode lines are manufactured using the conventional imprint lithography process as described above, the foregoing drawbacks may lead to interaction (e.g., electrical connection) between the metal electrode lines, thus making it difficult to form independent metal electrodes.

Conventionally, in order to prevent occurrence of interaction between the metal electrode lines, an insulating layer is formed on the metal electrode lines disposed on the substrate or metal patterns are formed in an insulating layer. However, according to these conventional methods, it is still difficult to form completely independent metal electrode lines to submicrometer levels.

SUMMARY OF THE INVENTION

The present invention is directed to a method of manufacturing nanoelectrode lines in which completely independent metal electrode lines are formed between insulating layer patterns using an imprint lithography process.

Also, the present invention is directed to a method of manufacturing nanoelectrode lines in which a polymer pattern for an electronic device is formed on a substrate having metal electrode lines.

One aspect of the present invention provides a method of manufacturing nanoelectrode lines. The method includes the steps of: sequentially forming an insulating layer, a first photoresist layer, and a drop-shaped second photoresist on a substrate; disposing an imprint mold having a plurality of molding patterns over the second photoresist; applying pressure to the mold to allow the second photoresist to flow into the mold patterns; irradiating ultraviolet (UV) light onto the mold to cure the second photoresist; removing the mold from the cured second photoresist and patterning the second photoresist; patterning the first photoresist layer using the patterned second photoresist as a mask; patterning the insulating layer; and forming a metal layer between the patterned insulating layers.

The patterning of the second photoresist and the patterning of the insulating layer may be performed using halogen plasma. The patterning of the first photoresist layer may be performed using oxygen ($O_2$) plasma. The insulating layer may be formed of $SiO_2$, $SiN_x$, or alumina.

The formation of the metal layer between the patterned insulating layers may include the sub-steps of: coating the metal layer on the entire surface of the substrate; and removing the patterned first photoresist layer and the second photoresist. The removal of the first photoresist layer and the second photoresist may be performed using a liftoff process. The first photoresist layer and the second photoresist may be formed of photoresist having a strong solubility against acetone. The photoresist may be polymethyl methacrylate (PMMA) or resin.

The method may further include the step of forming an active layer for an electronic device on the metal layer after forming the metal layer. The active layer formed on the metal layer may be formed of at least one of an organic molecular material and a polymer material.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will now be described more fully with reference to the accompanying drawings, in which exemplary embodiments of the invention are shown. This invention may, however, be embodied in different forms and should not be construed as limited to the embodiments set forth herein.

Figure 1:
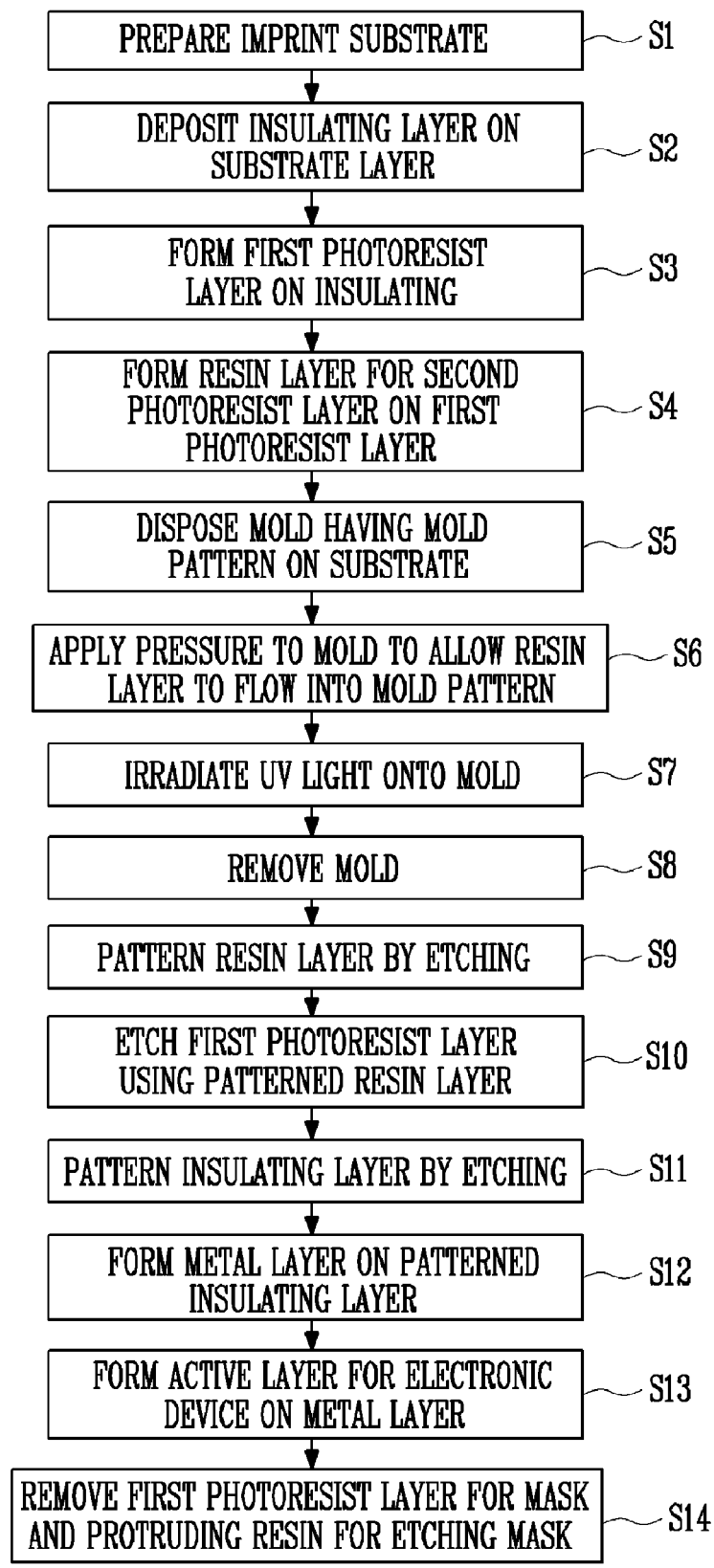
FIG. 1 is a flowchart illustrating a method of manufacturing nanoelectrode lines between insulating layer patterns using a nanoimprint lithography process according to an exemplary embodiment of the present invention.

FIG. 1 is a flowchart illustrating a method of manufacturing nanoelectrode lines between insulating layer patterns using a nanoimprint lithography process according to an exemplary embodiment of the present invention, and FIGS. 2A through 2J are cross-sectional views illustrating the method shown in FIG. 1.

Figure 2A:
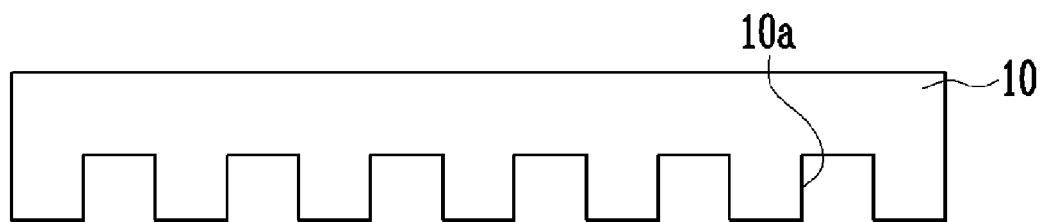
FIGS. 2A through 2J are cross-sectional views illustrating the method shown in FIG. 1.
Figure 2A:
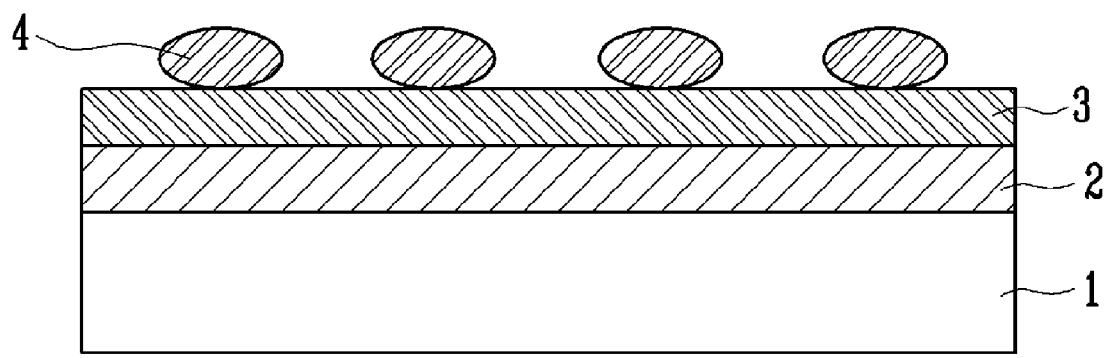

Referring to FIGS. 1 and 2A, first, an imprint substrate 1 is prepared in step S1. The imprint substrate 1 may be a silicon wafer. In the present embodiment, the silicon wafer may be a 200-mm thick double-sided silicon wafer.

In step S2, an insulating layer 2 is deposited on the imprint substrate 1. The insulating layer 2 is formed of one of $SiO_2$, $SiN_x$, and alumina to a thickness of about 3000 Å. In steps S3 and S4, a first photoresist layer 3 and a second photoresist 4 are sequentially formed on the insulating layer 2. A nanoimprint lithography process according to the present invention is performed using a bilayer photoresist system. Thus, a structure having a high aspect ratio can be obtained, and lateral undercut regions can be formed in the first photoresist layer 3 to facilitate a subsequent liftoff process for separating a metal layer deposited between patterns from the first photoresist layers 3 and the second photoresist 4. The first photoresist layer 3 formed on the insulating layer 2, which may function as both a planarization layer and a transfer layer for the substrate 1, may be formed of photoresist, such as polymethyl methacrylate (PMMA). In particular, the first photoresist layer 3 according to the embodiment is formed by spin coating 950K PMMA A2 on the insulating layer 2 at a rate of 4000 to 5000 revolutions per minute (RPM) for 30 to 50 seconds. In this case, the first photoresist layer 3 is spin-coated to a thickness of about 60 to 80 nm. After the spin coating of the first photoresist layer 3 is finished, the resultant structure is hard baked at a temperature of about 200° C. for 10 minutes. The first photoresist layer 3 is etched using oxygen ($O_2$) plasma to a smaller thickness of about 25 nm, so that the first photoresist layer 3 may function as a planarization layer during a subsequent step-and-flash process and also function as a residual layer to be removed after an imprint lithography process and before deposition of a metal layer. In this case, the $O_2$ plasma is supplied under process conditions for reducing surface roughness, specifically, under the conditions of a radio-frequency (RF) power of 20W, an $O_2$ flow rate of 10 sccm, a pressure of 10 mtorr, and a treatment time of 30 seconds. Thus, the residual layer can be reduced, and reactive species of the $O_2$ plasma and $O_2$ can be injected into the first photoresist layer 3 formed of PMMA so that the surface of the first photoresist layer 3 can be modified to increase surface energy thereof. As a result, adhesion force between the second photoresist layer 4 formed of resin, which is formed on the first photoresist layer 3, and the first photoresist layer 3 can be enhanced. Thus, after mold patterns 10a are transferred to the surface of the substrate 1, when a mold 10 is detached from the first photoresist layer 3 and the second photoresist 4, the second photoresist (i.e., a resin layer) 4 does not stick to the surface of the mold 10, thereby forming the mold patterns 10a without defects.

The resin layer (i.e., the second photoresist) 4, which will function as an etch mask, is formed in the shape of drops on the first photoresist layer 3. The resin layer 4 is formed of ultraviolet (UV)-curable resin, which is a kind of photoresist. More specifically, in the present embodiment, the UV-curable resin may be an acrylate-based monomer containing silicon having a high resistance to $O_2$ plasma. The resin layer 4 is formed in a zigzag type on the first photoresist layer 3 using a double jet dispensing method. When spraying resin for the resin layer 4 in the zigzag type, a residual layer of the second photoresist 4 sprayed on the first photoresist layer 3 can be minimized, and the resin layer 4 can be uniformly coated on the first photoresist layer 3. The resin layer 4 is sprayed in the shape of drops on the first photoresist layer 3, and the amount of a monomer contained in the resin for the resin layer 4 is controlled to be in the range of 0.12 to 0.15 µl.

After the resin layer 4 is formed on the substrate 1, the mold 10 having a plurality of mold patterns 10a is disposed over the substrate 1 to face the resin layer 4 in step S5. The mold patterns 10a include convex portions and concave portions between which there is a step difference of several tens of nm to several µm. Typically, since the mold 10 needs to transmit UV light, it is formed of quartz. In the present embodiment, UV light irradiated to the mold 10 has a wavelength of about 365 nm. Meanwhile, before the imprint lithography process is performed, a self-assembly monolayer is wet coated by dipping the mold 10 in a tridecafluoro-1,1,2,2-tetrahydrooctyl-1-trichlorosilane (FTS) solution or the self-assembled monolayer is formed in a gas phase in order to minimize adhesion between the mold 10 and the UV-curable resin layer 4 and have an anti-sticking effect. The imprint lithography process according to the embodiment is performed using an apparatus so that UV light can pass through the mold 10 and UV-curable resin fills the mold patterns 10a to transfer the mold patterns 10a to the surface of the substrate 1. The imprint lithography process is performed using an IMPRIO 100 system manufactured by Molecular Imprint Inc.

Figure 2B:
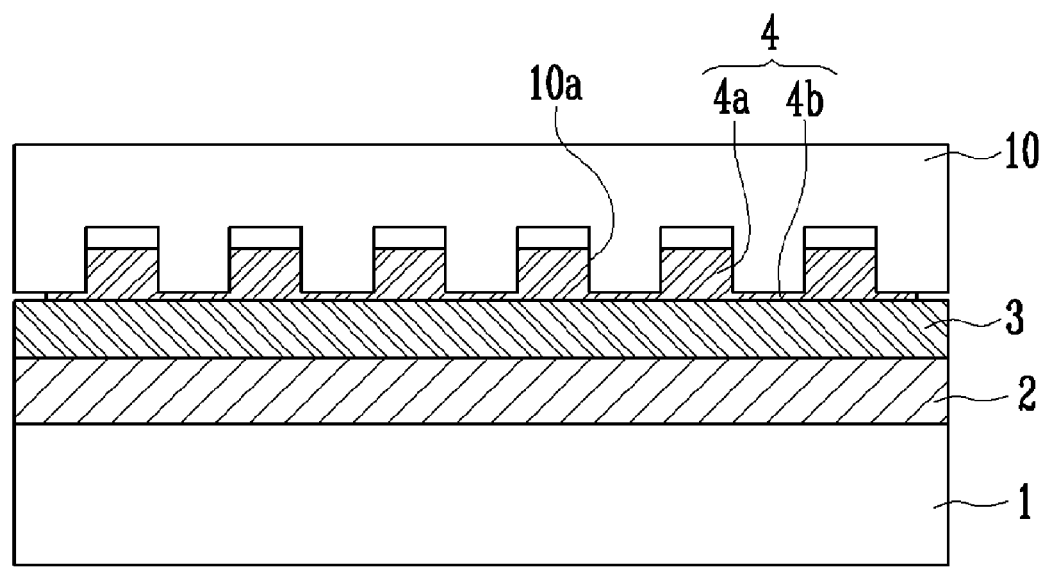

Referring to FIGS. 1 and 2B, a predetermined pressure is applied to the mold 10 for 150 seconds so that the UV-curable resin layer 4 with a shape of drops can flow between the mold patterns 10a in step S6. In this case, a pressure of about 2N is applied to the mold 10. When pressure is applied to the resin layer 4 by the mold 10, resin drops flow between the mold patterns 10a formed in the mold 10.

Figure 2C:
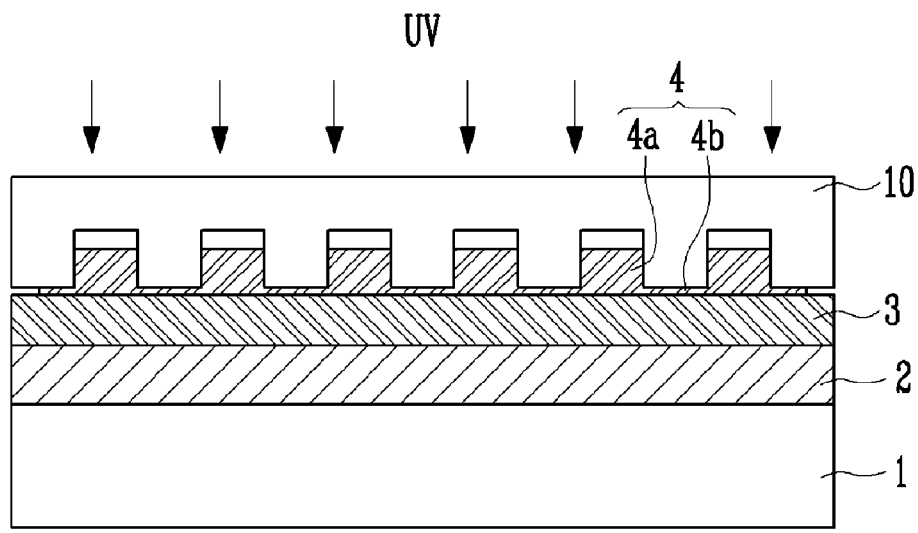
Figure 2D:
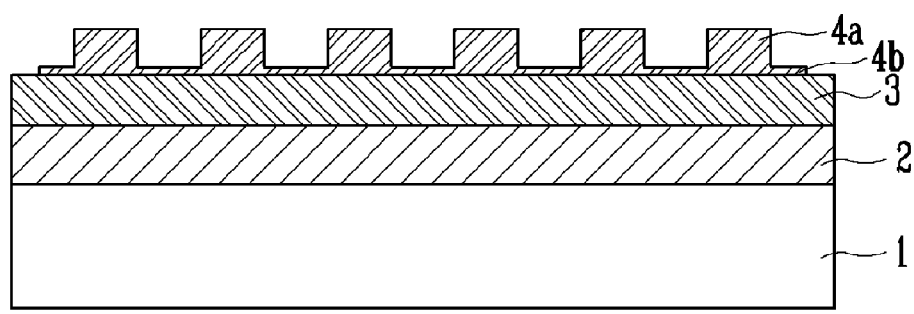

Referring to FIGS. 1, 2C, and 2D, UV light is irradiated onto the mold 10 in step S7. When the UV light is irradiated for 15 seconds, liquid-phase resin is cured and changed into solid-phase resin. After the resin is cured due to UV irradiation, the mold 10 is removed in step S8. As a result, the resin layer 4 is divided into a protruding resin layer 4a, which flows between the mold patterns 10a and is cured, and a residual resin layer 4b, which is planarized between portions of the protruding resin layer 4a.

Figure 2E:
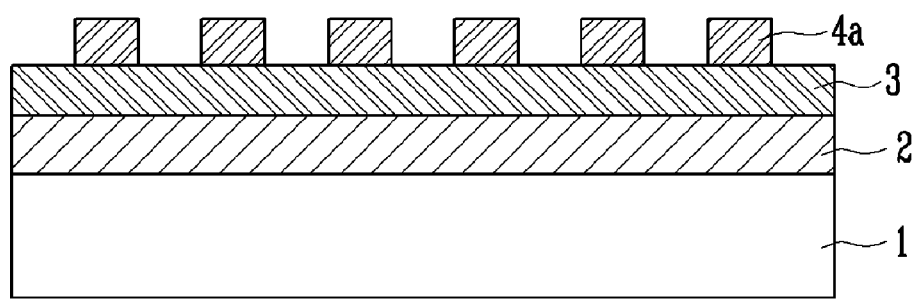

Referring to FIGS. 1 and 2E, in step S9, the resin layer 4 is patterned by etching so that the residual resin layer 4b is removed from the first photoresist layer 3 and the protruding resin layer 4a is left to be used as a silicon-based etch mask. In the embodiment, the resin layer 4 is etched using a halogen plasma process. Specifically, the residual resin layer 4b is etched using an Oxford Plasmalab 100 ICP 380 etcher as an inductively coupled plasma (ICP) apparatus by supplying $CF_4$ at a flow rate of about 20 standard cubic centimeters per minute (sccm) for about 20 seconds with a power of about 20 W under a pressure of about 20 mtorr. In this case, the residual resin layer 4b is etched at a rate of 0.3 nm/s.

Figure 2F:
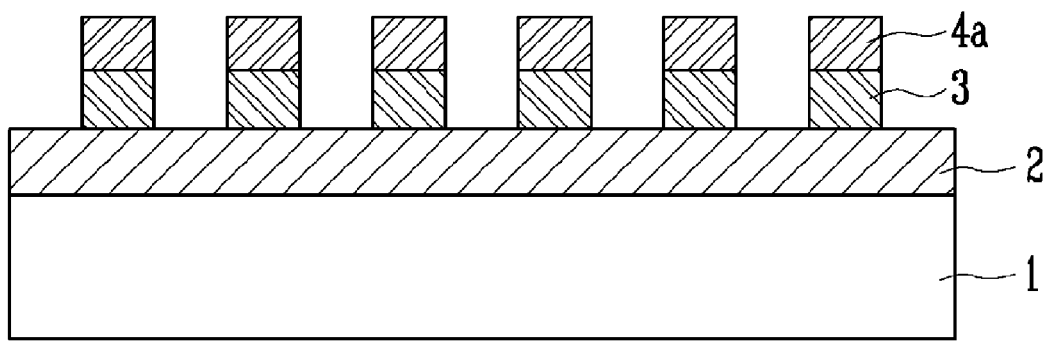

Referring to FIGS. 1 and 2F, when the residual resin layer 4b is removed and the first photoresist layer 3 is exposed, the first photoresist layer 3 is etched by generating $O_2$ plasma at an $O_2$ flow rate of 20 sccm with a power of 50W under a pressure of 30 mtorr for 14 seconds in step S10. The first photoresist layer 3 formed of PMMA may be easily etched at a rate of, for example, 4 nm/s, which is about 22 times higher than the etch rate of the protruding resin layer 4a functioning as the etch mask.

Figure 2G:
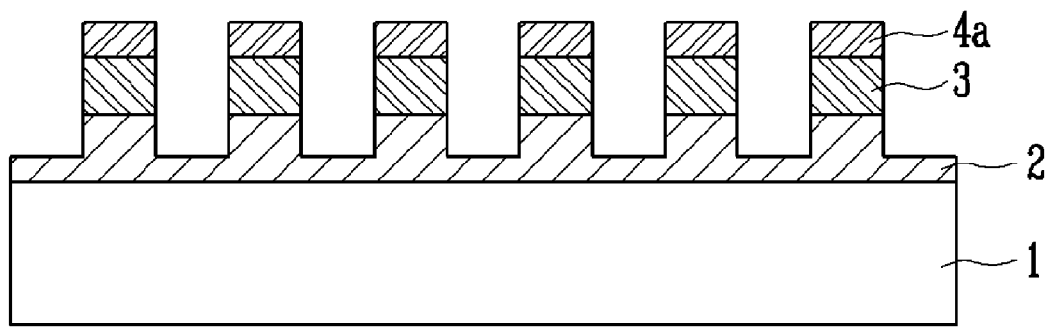

Referring to FIGS. 1 and 2G, after the second and first photoresist layers 4 and 3 are patterned, the insulating layer 2 is patterned by etching using the protruding resin layer 4a and the first photoresist layer 3 as a mask in step S11. The patterning of the insulating layer 2 is also performed using a halogen plasma process. In the embodiment, the insulating layer 2 is etched using an ICP apparatus by supplying $CHF_3$ and $O_2$ at flow rates of 45 and 5 sccm, respectively, with an ICP power of about 600 W under a pressure of about 6 mtorr for 2 minutes. When etching the insulating layer 2, the protruding resin layer 4a is partially etched.

Figure 2H:
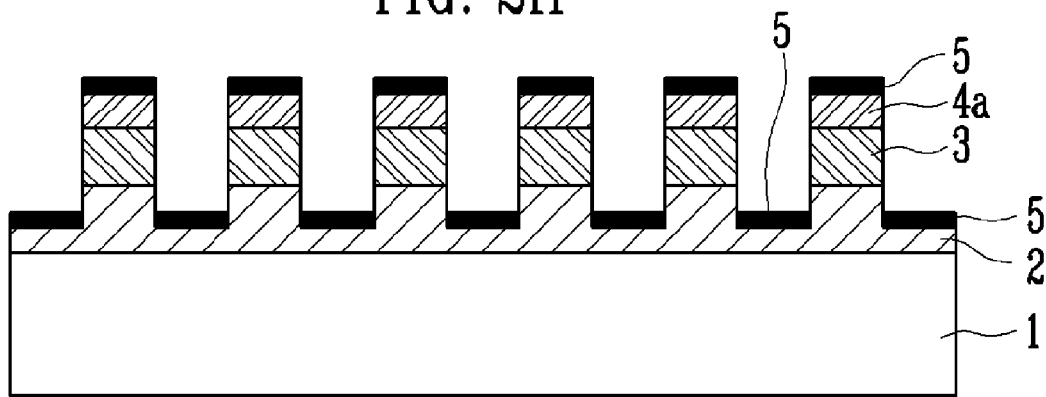

Referring to FIGS. 1 and 2H, in step S12, a metal layer 5 is deposited on the entire surface of the substrate 1 on which the insulating layer 2 is etched. The metal layer 5 is formed by depositing Ti/Au using an electronic-beam (e-beam) evaporator.

Figure 2I:
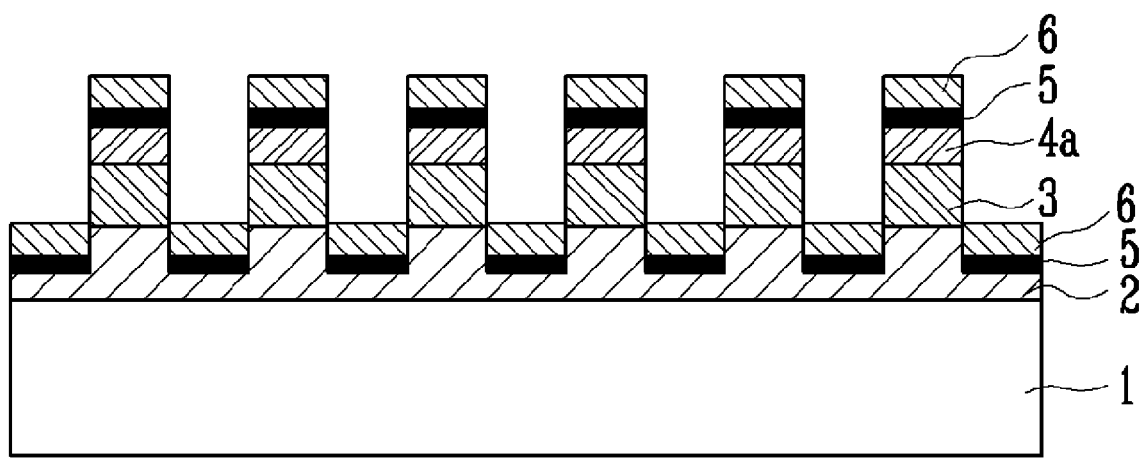

Referring to FIGS. 1 and 2I, in step S13, the metal layer 5 is coated with an active layer 6 to be used as a component for an electronic device. The active layer 6 is formed of at least one of an organic molecular material and a conductive polymer material.

The organic molecular material may include a self-assembly monomer that is self-assembled on an Au layer of the metal layer 5 by a —SH group. In this case, the substrate 1 having the metal layer 5 may be dipped in an organic solution, in which organic molecules are dissolved, for a predetermined amount of time so that the active layer 6 formed of the organic molecular material is obtained. The active layer 6 formed of the organic molecular material has a molecular structure having polar functional groups at both ends. When an upper layer of the metal layer 5 is an Au layer, the active layer 6 may be formed of an organic molecular material having a —SH group at one end and a polar group selected from the group consisting of —OH, —SH,—$SO_3NA$, —COOH, and —NH groups at the other end. Meanwhile, when a conductive polymer material layer is coated on the organic molecular material layer in a subsequent process, the polar group serves to fix the conductive polymer material layer. For example, the organic molecular material layer may be formed of C1-C20 alkanethiolates, C1-C20 alkanethiol, 2-mercaptoimidazole, 2-mercaptopyrimidine, cysteine, or 4-mercaptopyridine which is terminated with COOH. Accordingly, the conductive polymer material layer may be electrostatically coupled to the organic molecular material layer.

The conductive polymer material layer may be formed of a conductive polymer, for example, PEDOT/PSS(poly(3,4-ethylenedioxythiophene doped with poly(4-styrenesulonate)), polypyrrole, poly aniline, poly(3,4-ethylenethiophene), polyporphyrins, polyferrocenes, or polymetallocenes, such as polyphthalocyanines. The conductive polymer material layer may be formed using a spin coating process. For instance, the formation of the conductive polymer material layer may include spin coating a conductive polymer solution obtained by diluting PEDOT/PSS(poly(3,4-ethylenedioxythiophene) doped with poly(4-styrenesulonate)) or polypyrrole with a solvent (e.g., water) and annealing the conductive polymer solution spin-coated on the organic molecular material layer.

Figure 2J:
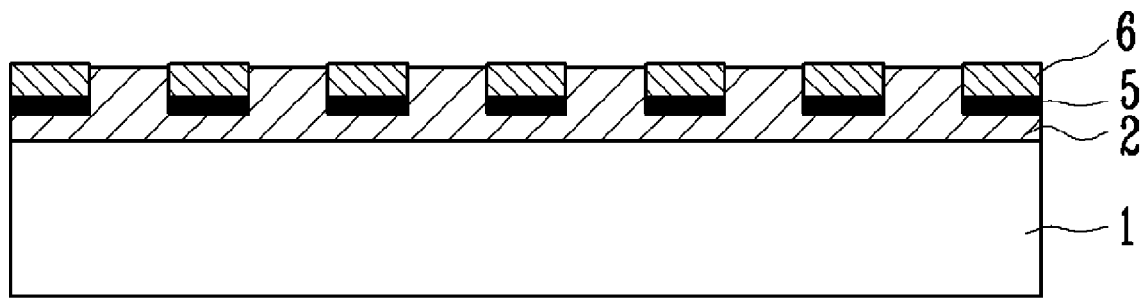

Referring to FIGS. 1 and 2J, the first photoresist layer 3 used as a mask and the protruding resin layer 4a used as an etch mask are removed in step S14. In this case, when the first photoresist layer 3 formed of PMMA is lifted off, final patterns including metal electrode lines in which the insulating layer 2 and the line-shaped metal layer 5 with a sub-linewidth of 50 nm are alternately disposed are formed. In the embodiment, the first photoresist layer 3 is lifted off using acetone.

According to the present embodiment, after the insulating layer 2 is patterned, the metal layer 5 and the organic molecular material layer for the active layer 6 are deposited on the entire surface of the substrate 1, and the first photoresist layer 3 and the protruding resin layer 4a are removed using acetone. Thus, the final patterns including the patterned insulating layer 2 and the line-shaped metal layer 5 interposed between the patterned insulating layers 2 are formed. However, in another case, an etching process is performed until the insulating layer 2 is not yet exposed. Thereafter, a self-assembly thin layer having a hydrophobic $CH_3$ group at a terminal group such as an octadecyltrichlorosilane (OTS) layer is formed between the insulating layers 2 in a gas phase, and the first photoresist layer 3 and the protruding resin layer 4a are removed. Then, patterns of the self-assembly thin layer are formed on the surface of the insulating layer. Subsequently, a hydrophilic polymer material, such as PEDOT/PSS(poly(3,4-ethylenedioxythiophene) doped with poly(4-styrenesulfonate)) or polypyrrole, which is not combined with a hydrophobic material such as —$CH_3$ which is a terminal group of the self-assembly layer is coated, thereby forming conductive polymer patterns.

According to the present invention as described above, an insulating layer and a metal layer are alternately formed so that respective metal electrode lines are independently formed to prevent occurrence interaction therebetween. Thus, nanoelectronic devices can be freed from crosstalk between the metal electrode lines. Furthermore, the metal electrode lines are independently formed using insulating layers that are previously formed on a substrate, so it is unnecessary to form an additional insulating layer on a conventional metal layer. As a result, nanoelectronic devices can be produced in large quantities at low cost.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing nanoelectrode lines, comprising the steps of:

sequentially forming an insulating layer, a first photoresist layer, and a drop-shaped second photoresist on a substrate;

disposing an imprint mold having a plurality of molding patterns over the second photoresist;

applying pressure to the mold to allow the second photoresist to flow into the mold patterns;

irradiating ultraviolet (UV) light onto the mold to cure the second photoresist;

removing the mold from the cured second photoresist and patterning the second photoresist;

patterning the first photoresist layer using the patterned second photoresist as a mask;

patterning the insulating layer using the patterned first photoresist layer and the patterned second photoresist as a mask, such that the patterned insulating layer includes a plurality of concave portions and a plurality of convex portions, and each convex portion is formed under the patterned first photoresist layer; and forming a metal layer on each concave portion of the patterned insulating layer.

2. The method according to claim 1, wherein the steps of patterning the second photoresist and patterning the insulating layer are performed using halogen plasma.

3. The method according to claim 1, wherein the step of patterning the first photoresist layer is performed using oxygen ($O_2$) plasma.

4. The method according to claim 1, wherein the insulating layer is formed of one selected from the group consisting of $SiO_2$, $SiN_x$, and alumina.

5. The method according to claim 1, wherein the step of forming the metal layer comprises the sub-steps of:
    coating the metal layer on the entire surface of the substrate; and
    removing the patterned first photoresist layer and the second photoresist.

6. The method according to claim 5, wherein the step of removing the first photoresist layer and the second photoresist is performed using a liftoff process.

7. The method according to claim 6, wherein the first photoresist layer and the second photoresist are formed of photoresist having a strong solubility against acetone.

8. The method according to claim 7, wherein the first photoresist layer and the second photoresist are one of polymethyl methacrylate (PMMA) and resin.

9. The method according to claim 1, further comprising the step of forming an active layer for an electronic device on the metal layer after forming the metal layer.

10. The method according to claim 8, wherein the active layer formed on the metal layer is formed of at least one of an organic molecular material and a polymer material.

11. The method according to claim 1, wherein the step of forming the metal layer comprises the sub-steps of:
    coating the metal layer both on the concave portions of the patterned insulating layer and on the patterned second photoresist;
    forming an active layer on the coated metal layer; and
    removing the patterned first photoresist layer, the patterned second photoresist, the metal layer formed on the patterned second photoresist and the active layer formed on the patterned second photoresist, such that each convex portion of the insulating layer is exposed, and the metal layer disposed on each concave portion of the insulating layer is interposed between two adjacent convex portions of the insulating layer.

* * * * *